US007835535B1

(12) United States Patent
Trautmann et al.

(10) Patent No.: US 7,835,535 B1
(45) Date of Patent: Nov. 16, 2010

(54) VIRTUALIZER WITH CROSS-TALK CANCELLATION AND REVERB

(75) Inventors: Steven D. Trautmann, Ibaraki (JP); Atsuhiro Sakurai, Tsukuba (JP); Hironori Kakemizu, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 1295 days.

(21) Appl. No.: 11/364,951

(22) Filed: Mar. 1, 2006

Related U.S. Application Data

(60) Provisional application No. 60/756,065, filed on Jan. 4, 2006, provisional application No. 60/657,234, filed on Feb. 28, 2005.

(51) Int. Cl.
*H04R 5/02* (2006.01)
*H04R 5/00* (2006.01)
*H03G 3/00* (2006.01)

(52) U.S. Cl. ............................ 381/310; 381/1; 381/63; 381/303; 381/307

(58) Field of Classification Search .................... 381/1, 381/17, 18, 19, 25, 56, 61, 74, 303, 307, 381/309, 310, 63
See application file for complete search history.

(56) References Cited

U.S. PATENT DOCUMENTS

| | | | | |
|---|---|---|---|---|
| 5,579,396 | A * | 11/1996 | Iida et al. | 381/18 |
| 6,307,941 | B1 * | 10/2001 | Tanner et al. | 381/17 |
| 6,714,652 | B1 * | 3/2004 | Davis et al. | 381/17 |
| 7,536,017 | B2 * | 5/2009 | Sakurai et al. | 381/17 |

* cited by examiner

*Primary Examiner*—Xu Mei
*Assistant Examiner*—Friedrich Fahnert
(74) *Attorney, Agent, or Firm*—Mima Abyad; Wade J. Brady, III; Frederick J. Telecky, Jr.

(57) ABSTRACT

Audio loudspeaker and headphone virtualizers and cross-talk cancellers and methods use separate virtual speaker locations for different Bark frequency bands and a single reverberation filter for multi-channel virtualizer inputs.

3 Claims, 6 Drawing Sheets

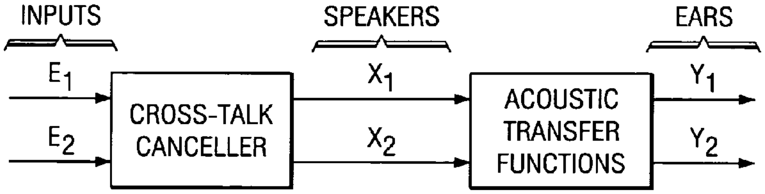

*FIG. 3*
*(PRIOR ART)*

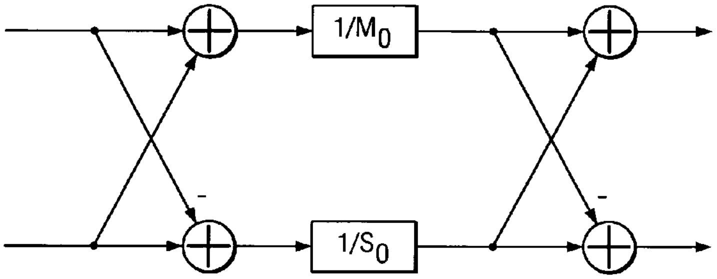

*FIG. 4a*
*(PRIOR ART)*

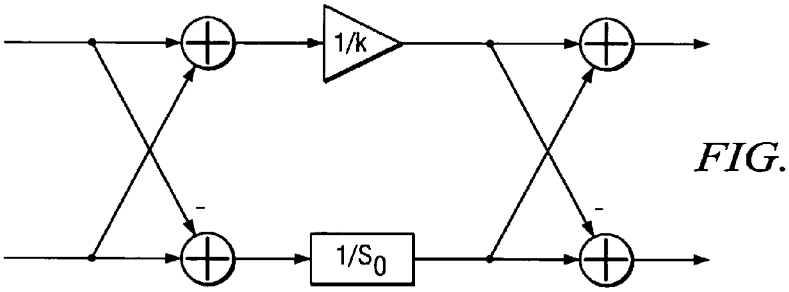

*FIG. 4b*

*FIG. 5*
*(PRIOR ART)*

| | | | |
|---|---|---|---|
| BARK BAND 1 | 0 TO 100 Hz | BARK BAND 14 | 2000 TO 2320 Hz |
| BARK BAND 2 | 100 TO 200 Hz | BARK BAND 15 | 2320 TO 2700 Hz |
| BARK BAND 3 | 200 TO 300 Hz | BARK BAND 16 | 2700 TO 3150 Hz |
| BARK BAND 4 | 300 TO 400 Hz | BARK BAND 17 | 3150 TO 3700 Hz |
| BARK BAND 5 | 400 TO 510 Hz | BARK BAND 18 | 3700 TO 4400 Hz |
| BARK BAND 6 | 510 TO 630 Hz | BARK BAND 19 | 4400 TO 5300 Hz |
| BARK BAND 7 | 630 TO 770 Hz | BARK BAND 20 | 5300 TO 6400 Hz |
| BARK BAND 8 | 770 TO 920 Hz | BARK BAND 21 | 6400 TO 7700 Hz |
| BARK BAND 9 | 920 TO 1080 Hz | BARK BAND 22 | 7700 TO 9500 Hz |
| BARK BAND 10 | 1080 TO 1270 Hz | BARK BAND 23 | 9500 TO 12000 Hz |
| BARK BAND 11 | 1270 TO 1480 Hz | BARK BAND 24 | 12000 TO 15500 Hz |
| BARK BAND 12 | 1480 TO 1720 Hz | BARK BAND 25 | 15500 TO 24000 Hz |
| BARK BAND 13 | 1720 TO 2000 Hz | | |

VIRTUALIZER WITH CROSS-TALK CANCELLATION AND REVERB

CROSS-REFERENCE TO RELATED APPLICATIONS

This application claims priority from provisional patent application Nos. 60/657,234, filed Feb. 28, 2005 and 60/756,065, filed Jan. 4, 2006. The following co-assigned copending applications disclose related subject matter: application Ser. No. 11/125,927, filed May 10, 2005.

BACKGROUND OF THE INVENTION

The present invention relates to digital audio signal processing, and more particularly to loudspeaker and headphone virtualization and cross-talk cancellation devices and methods.

Multi-channel audio inputs designed for multiple loudspeakers can be processed to drive a single pair of loudspeakers and/or headphones to provide a perceived sound field simulating that of the multiple loudspeakers. In addition to creation of such virtual speakers for surround sound effects, signal processing can also provide changes in perceived listening room size and shape by control of effects such as reverberation.

Multi-channel audio is an important feature of DVD players and home entertainment systems. It provides a more realistic sound experience than is possible with conventional stereophonic systems by roughly approximating the speaker configuration found in movie theaters. FIG. 2*b* illustrates an example of multi-channel audio processing known as “virtual surround” which consists of creating the illusion of a multi-channel speaker system using a conventional pair of loudspeakers. This technique makes use of transfer functions from virtual loudspeakers to a listener’s ears; that is, transfer functions made from the head-related transfer function (HRTF) of the direct path and of all the reflections of the virtual listening environment. A room transfer function is largely unknown, but the actual HRTFs (which are functions of the angles between source direction and head direction) can be approximated by use of a library of measured HRTFs. For example, Gardner, Transaural 3-D Audio, MIT Media Laboratory Perceptual Computing Section Technical Report No. 342, Jul. 20, 1995, provides HRTFs for every 5 degrees (azimuthal).

FIG. 2*e* shows functional blocks of an implementation for the (real plus virtual) speaker arrangement of FIG. 2*b*; this requires cross-talk cancellation for the real speakers as shown in the lower right of FIG. 2*e*. Here cross-talk denotes the signal from the right speaker that is heard at the left ear and vice-versa. The basic solution to eliminate cross-talk was proposed in U.S. Pat. No. 3,236,949 and is explained as follows. Consider a listener facing two loudspeakers as shown in FIG. 2*a*. Let $X_1(e^{j\omega})$ and $X_2(e^{j\omega})$ denote the (short-term) Fourier transforms of the analog signals which drive the left and right loudspeakers, respectively, and let $Y_1(e^{j\omega})$ and $Y_2(e^{j\omega})$ denote the Fourier transforms of the analog signals actually heard at the listener’s left and right ears, respectively. Presuming a symmetrical speaker arrangement, the system can then be characterized by two HRTFs, $H_1(e^{j\omega})$ and $H_2(e^{j\omega})$, which respectively relate to the short and long paths from speaker to ear; that is, $H_1(e^{j\omega})$ is the transfer function from left speaker to left ear or right speaker to right ear, and $H_2(e^{j\omega})$ is the transfer function from left speaker to right ear and from right speaker to left ear. This situation can be described as a linear transformation from $X_1$, $X_2$ to $Y_1$, $Y_2$ with a 2×2 matrix having elements $H_1$ and $H_2$:

$$\begin{bmatrix} Y_1 \\ Y_2 \end{bmatrix} = \begin{bmatrix} H_1 & H_2 \\ H_2 & H_1 \end{bmatrix} \begin{bmatrix} X_1 \\ X_2 \end{bmatrix}$$

Note that the dependence of $H_1$ and $H_2$ on the angle that the speakers are offset from the facing direction of the listener has been omitted.

FIG. 3 shows a cross-talk cancellation system in which the input electrical signals (short-term Fourier transformed) $E_1(e^{j\omega})$, $E_2(e^{j\omega})$ are modified to give the signals $X_1$, $X_2$ which drive the loudspeakers. (Note that the input signals $E_1$ $E_2$ are the recorded signals, typically using either a pair of moderately-spaced omni-directional microphones or a pair of adjacent uni-directional microphones with an angle between the two microphone directions.) This conversion from $E_1$, $E_2$ into $X_1$, $X_2$ is also a linear transformation and can be represented by a 2×2 matrix. If the target is to reproduce signals $E_1$, $E_2$ at the listener’s ears (so $Y_1=E_1$ and $Y_2=E_2$) and thereby cancel the effect of the cross-talk (due to $H_2$ not being 0), then the 2×2 matrix should be the inverse of the 2×2 matrix having elements $H_1$ and $H_2$. That is, taking $$\begin{bmatrix} X_1 \\ X_2 \end{bmatrix} = \begin{bmatrix} H_1 & H_2 \\ H_2 & H_1 \end{bmatrix}^{-1} \begin{bmatrix} E_1 \\ E_2 \end{bmatrix} = \frac{1}{H_1^2 - H_2^2} \begin{bmatrix} H_1 & -H_2 \\ -H_2 & H_1 \end{bmatrix} \begin{bmatrix} E_1 \\ E_2 \end{bmatrix}$$

yields $Y_1=E_1$ and $Y_2=E_2$.

An efficient implementation of the cross-talk canceller diagonalizes the 2×2 matrix having elements $H_1$ and $H_2$:

$$\begin{bmatrix} H_1 & H_2 \\ H_2 & H_1 \end{bmatrix} = \frac{1}{2} \begin{bmatrix} 1 & 1 \\ 1 & -1 \end{bmatrix} \begin{bmatrix} M_0 & 0 \\ 0 & S_0 \end{bmatrix} \begin{bmatrix} 1 & 1 \\ 1 & -1 \end{bmatrix}$$

where $M_0(e^{j\omega})=H_1(e^{j\omega})+H_2(e^{j\omega})$ and $S_0(e^{j\omega})=H_1(e^{j\omega})-H_2(e^{j\omega})$. Thus the inverse becomes simple to compute:

$$\begin{bmatrix} H_1 & H_2 \\ H_2 & H_1 \end{bmatrix}^{-1} = \frac{1}{2} \begin{bmatrix} 1 & 1 \\ 1 & -1 \end{bmatrix} \begin{bmatrix} 1/M_0 & 0 \\ 0 & 1/S_0 \end{bmatrix} \begin{bmatrix} 1 & 1 \\ 1 & -1 \end{bmatrix}$$

And the cross-talk cancellation is efficiently implemented as sum/difference detectors with the inverse filters $1/M_0(e^{j\omega})$ and)$1/S_0(e^{j\omega})$, as shown in FIG. 4*a*. This structure is referred to as the “shuffler” cross-talk canceller. U.S. Pat. No. 5,333,200 discloses this plus various other cross-talk signal processing.

However, a practical problem arises in the actual implementation due to approximate nulls in the transfer functions $M_0(e^{j\omega})=H_1(e^{j\omega})+H_2(e^{j\omega})$ and $S_0(e^{j\omega})=H_1(e^{j\omega})-H_2(e^{j\omega})$. The implementation of such filters would require considerable dynamic range reduction in order to avoid saturation about frequencies with response peaks. For example, with two real speakers each 30 degrees offset as in FIG. 2*a*, the log magnitude of $$\frac{1}{H_1^2 - H_2^2}$$

has the form illustrated by FIG. 2*g*. The range is from 0 Hz to 24000 Hz sampled every 93.75 Hz (using an FFT length of 512). The gain has been scaled so that the minimum gain is 1.0 or 0 on the log scale. Note the large peak near 8000 Hz (near frequency bin 90). This large peak in turn limits the available dynamic range. The cross-referenced copending application presents a method that is a simple and effective solution to this problem based on frequency band separation of the input signal using power complementary 11R filters. This method works well for time domain implementations, and in particular when a "shuffler" cross-talk canceller as in FIG. 4*a* is employed.

Now with cross-talk cancellation, the FIG. 2*b* virtual plus real loudspeaker arrangement can be simply created by use of the HRTFs for the offset angles of the speakers. In particular, let $H_1(\theta)$ and $H_2(\theta)$ denote the two HRTFs for a speaker offset by angle θ (or 360−θ by symmetry) from the facing direction of the listener. Then if the (short-term Fourier transform) of the speaker signal is denoted SS, then the corresponding left and right ear signals $E_1$ and $E_2$ would be $H_1(\theta)\cdot SS$ and $H_2(\theta)\cdot SS$, respectively, where θ is the angle of the speaker direction from the facing direction. These ear signals would be used as previously described for inputs to the cross-talk canceller; the cross-talk canceller outputs then drive the two real speakers to simulate a speaker an angle θ and driven by source SS.

For example, the left surround sound virtual speaker could be at an azimuthal angle of about 225 degrees. Thus with cross-talk cancellation, the corresponding two real speaker inputs to create the virtual left surround sound speaker would be:

$$\begin{bmatrix} X_1 \\ X_2 \end{bmatrix} = \frac{1}{H_1^2 - H_2^2}\begin{bmatrix} H_1 & -H_2 \\ -H_2 & H_1 \end{bmatrix}\begin{bmatrix} TF3_{left}\cdot LSS \\ TF3_{right}\cdot LSS \end{bmatrix}$$

where $H_1$, $H_2$ are for the left and right real speaker angles (e.g., 30 and 330 degrees), LSS is the (short-term Fourier transform of the) left surround sound signal, and $TF3_{left}=H_1(225)$, $TF3_{right}=H_2(225)$ are the HRTFs for the left surround sound speaker angle (225 degrees).

Again, FIG. 2*e* shows functional blocks for a virtualizer with the cross-talk canceller to implement 5-channel audio with two real speakers as in FIG. 2*b*; each speaker signal is filtered by the corresponding pair of HRTFs for the speaker's offset angle and distance, and the filtered signals summed and input into the cross-talk canceller and then into the two real speakers.

The conventional scheme for reducing the computational cost of multi-channel audio processing is to minimize the number of calculations involved in each FIR filtering process and does not consider the significant overhead introduced by multi-channel processing. The scheme can be described as a set of S×2 filters, where S is the number of sources. FIG. 2*h* illustrates a typical filtering scheme for the left output channel when S=5. The sound sources representing input channels are denoted C0, C1, C2, C3, and C4. The filter representing the path from C0 to the left ear is denoted $F_{full}$ [C0, left], and so on. The patterns in the block representing each $F_{full}$ indicate that the filter is made up of an early arrival section and a late reverberation section.

SUMMARY OF THE INVENTION

The present invention provides speaker virtualization with separate frequency bands virtualized at differing directions but with adjacent bands at adjacent directions and/or combined cross-talk cancellation and virtualizer filters for headphone or speaker applications and/or a rear surround sound virtual speaker by psychoacoustic reflection and/or separation of FIR filters into sections corresponding to early arrivals and late reverberation with the late reverberation section shared by all filters and/or a cross-talk canceling shuffler with simplified contra-lateral response.

BRIEF DESCRIPTION OF THE DRAWINGS

FIG. 3 is a high-level view of cross-talk cancellation.

FIGS. 4*a*-4*b* show shuffler cross-talk canceller arrangements.

FIG. 5 lists Bark frequency bands.

DESCRIPTION OF THE PREFERRED EMBODIMENTS

1. Overview

Preferred embodiment virtualizers and virtualization methods for multi-channel audio include filtering adapted to switching between loudspeakers and headphones, simplified reverberation by a common long-delay portion for all channels, cross-talk cancellation shuffler implementation with simplified inverse sum, Bark band based virtual locations for 2-channel input, and divided out peak frequencies for cross-talk cancellation simplification.

Preferred embodiment systems (e.g., home stereo sound systems, computer sound systems, et cetera) perform preferred embodiment methods with any of several types of hardware: digital signal processors (DSPs), general purpose programmable processors, application specific circuits, or systems on a chip (SoC) such as combinations of a DSP and a RISC processor together with various specialized programmable accelerators such as for FFTs and variable length coding (VLC). A stored program in an onboard or external flash EEPROM or FRAM could implement the signal processing.

2. Virtualizer with Peak Frequencies Divided Out

Figure 2A:
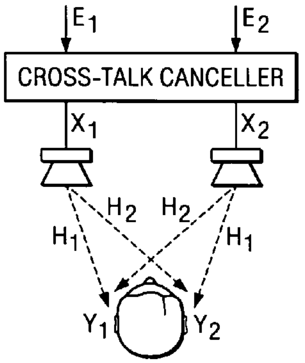
FIG. 2a (PRIOR ART)
FIGS. 2*a*-2*h* illustrate head-related acoustic transfer function and virtualizer geometries.
Figure 2B:
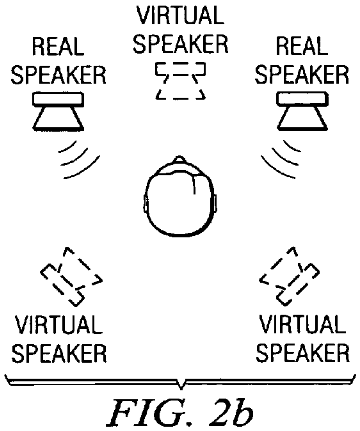
FIG. 2b (PRIOR ART)
Figure 2C:
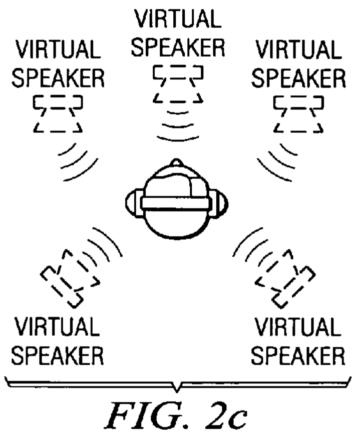
FIG. 2c (PRIOR ART)
Figure 2D:
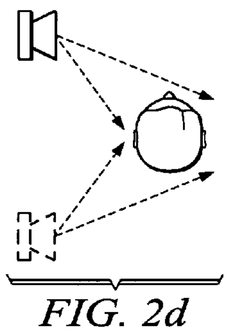
FIG. 2d (PRIOR ART)
Figure 2G:
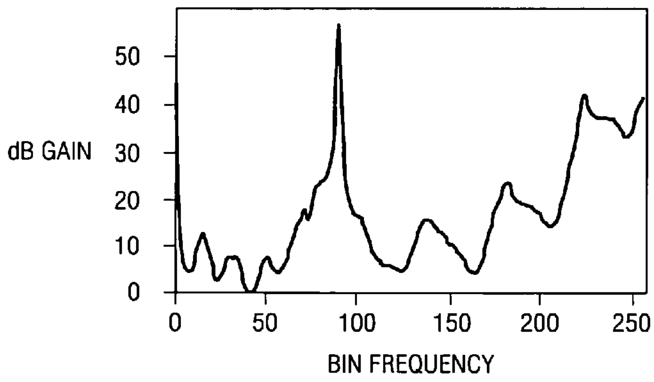
FIG. 2g (PRIOR ART)

If the two real speakers of FIG. 2*a* are placed at 30 degrees left and right of center, then the peak near 8000 Hz of FIG. 2*g* occurs as part of the cross-talk canceller. The first preferred embodiments simulate virtual rear speakers using a frequency domain cross-talk canceller implementation that deals with this troublesome frequency region. This approach utilizes a psychoacoustic phenomenon called front-back reversal that occurs with narrow-band signals. It is known that localization clues provided by HRTFs are not effective for narrow-band signals because their limited bandwidth cannot carry sufficient information about the spectral changes that characterize a given direction. In this case, the only clues to sound localization are provided by inter-aural differences: the Inter-aural time difference (ITD); i.e., the difference in arrival times of the signal (or its amplitude envelope for frequencies above 1500 Hz) at the two ears, and the inter-aural intensity difference (IID). However, with these clues alone it is often impossible to determine if a sound originated in front or back, resulting the phenomenon of front-back reversals. See FIG. 2*d* where the large peak around 8000 Hz can be interpreted as a range where the traditional cross-talk canceller just doesn't work well, due to the speaker placement and HRTFs involved. Therefore trying to use both speakers in this range is not very effective and the opposite side front speaker tends to cause problems. Preferred embodiments get around this by not using the opposite side speaker at these frequencies (since the combination of HRTFs and cross-talk cancellation does not work anyway) and take advantage of the psychoacoustic phenomenon of front-back reversals for narrow-band signals. Since all signals from the opposite side speaker are eliminated near 8000 Hz, it is easier to hear the sound as coming from a rear location since the ITD envelope clue is very clear. To further enhance the rear localization illusion, the spectral amplitude in this frequency band is modified to produce the best match for a sound coming from a rear location. This is done by dividing by the magnitude of the HRTFs for the same side front speaker, and multiplying by the HRTFs of the rear speaker (the rear speaker HRTF is used at all frequencies anyway). The result can be scaled to insure balance with neighboring frequencies.

Figure 1A:
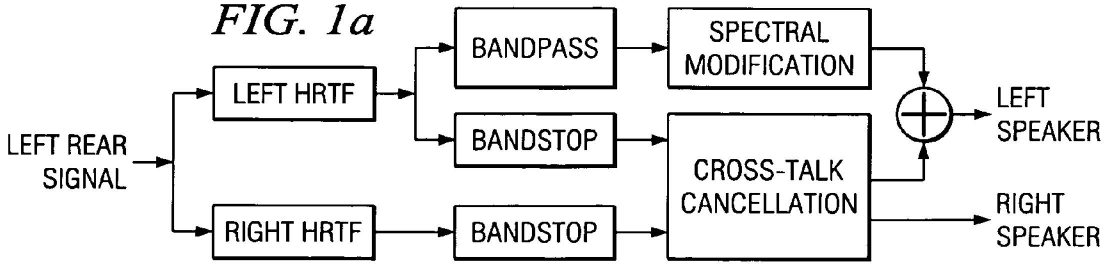
FIGS. 1*a*-1*g* show preferred embodiment filters and method flowcharts.

A block diagram is shown in FIG. 1*a*, though the actual implementation can vary. Here the bandpass block can pass frequencies from about 7900 Hz to 9350 Hz and likewise bandstop will block those frequencies. Note that this frequency band is completely kept out of the cross-talk canceller, resulting in no output from that block at those frequencies. In particular, no signal in that frequency band is passed to the right speaker. Also, the only signal in that frequency band passed to the left speaker has gone through the spectral modification block. This block modifies the spectrum within this frequency band to more closely match the HRTF from the left rear speaker when heard from the left front speaker by inverting the magnitude of the HRTF associated with the left front speaker as discussed in the preceding paragraph. Of course, to simulate the right rear speaker the same approach is taken by interchanging the roles of the left speaker and right speaker and using the right rear signal as input.

3. Virtualizer Switchable Between Headphones and Loudspeakers

Figure 2H:
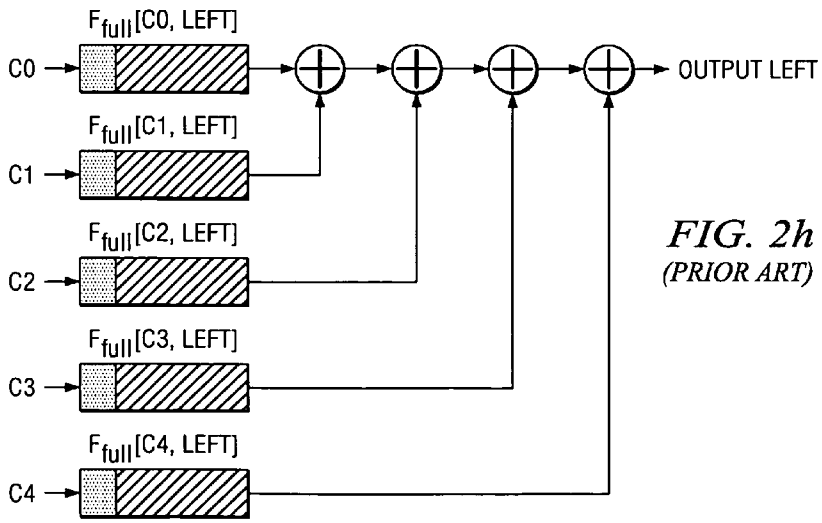
FIG. 2h (PRIOR ART)
Figure 2E:
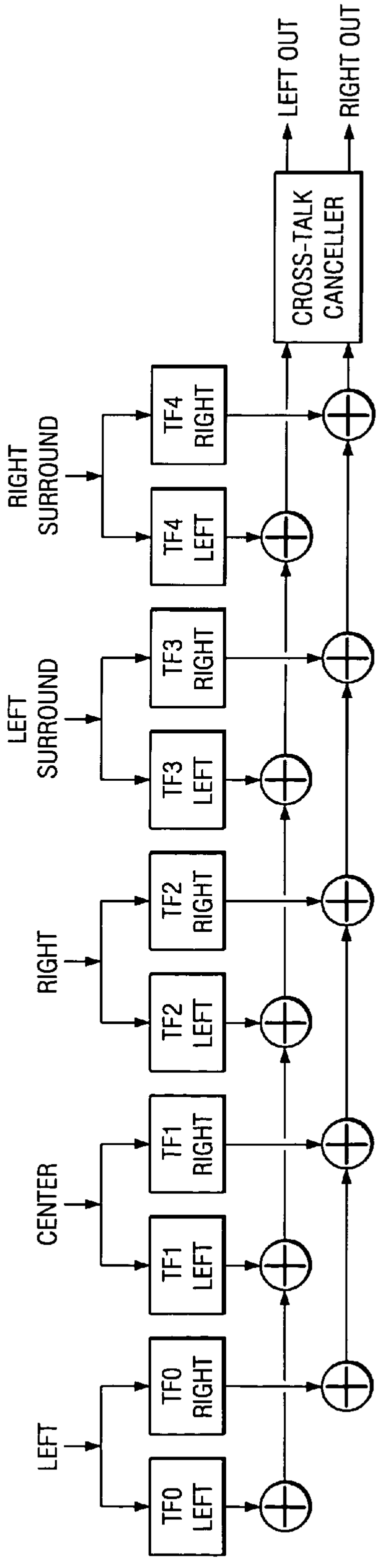
FIG. 2e (PRIOR ART)
Figure 2F:
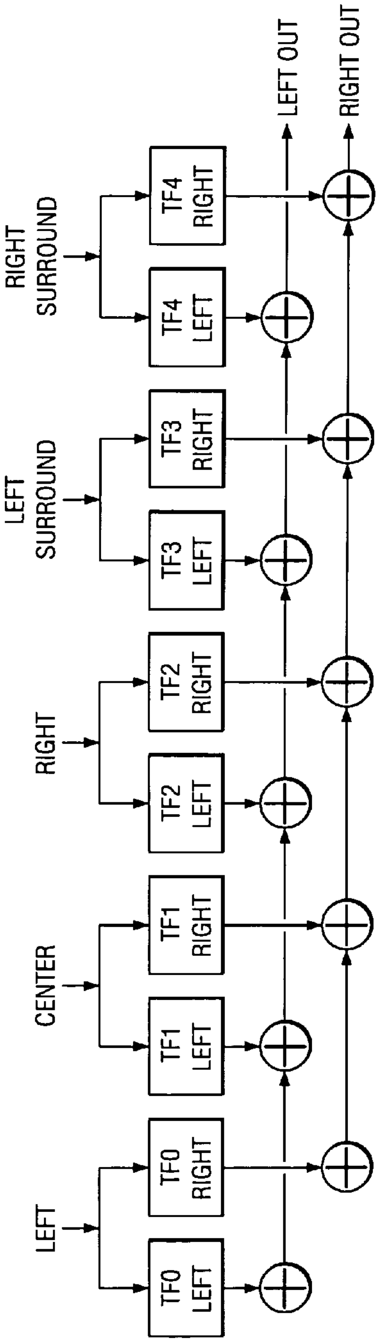
FIG. 2f (PRIOR ART)

FIGS. 2*e*-2*f* show functional blocks for 5-speaker virtualizers using either a pair of real loudspeakers or a set of headphones, respectively. These are identical except for the cross-talk canceller in FIG. 2*e* for the loudspeakers. Preferred embodiment methods push the cross-talk filter into the transfer function (TF) filters, and so the same methods and circuitry could be used for both virtual headphones and virtual speakers, which in turn saves program memory, reduces latency when switching from one to the other, and makes deployment and maintenance easier. That is, the transfer function filters have two modes: loudspeaker or headphone. The following paragraphs provide details.

Consider a single channel, say left surround, the left input to the cross-talk canceller will be the left surround signal, LSS, filtered by $TF3_{Left}$ and the right input to the cross-talk canceller will be the LSS filtered by $TF3_{Right}$. Thus the output of the cross-talk canceller which is input to the real speakers is as previously noted:

$$\begin{bmatrix} X_1 \\ X_2 \end{bmatrix} = \frac{1}{H_1^2 - H_2^2}\begin{bmatrix} H_1 & -H_2 \\ -H_2 & H_1 \end{bmatrix}\begin{bmatrix} TF3_{left} \cdot LSS \\ TF3_{right} \cdot LSS \end{bmatrix}$$

Then multiply everything out to get:

$$X_1 = \{(H_1 TF3_{Left} - H_2 TF3_{Right})(H_1^2 - H_2^2)\}LSS$$

$$X_2 = \{(H_1 TF3_{Right} - H_2 TF3_{Left})/(H_1^2 - H_2^2)\}LSS$$

By using these separate channel cross-talk canceling filters (SCCTC filters), cross-talk cancellation can be applied to any input using the functional blocks in FIG. 2*f*, without the need for an additional cross-talk canceller as in FIG. 2*e*. That is, for the case of headphones use the system of FIG. 2*f*, and in the case of two real speakers, use the system of FIG. 2*f* but with the filter substitutions:

$$TF3_{Left} \rightarrow (H_1 TF3_{Left} - H_2 TF3_{Right})/(H_1^2 - H_2^2)$$

$$TF3_{Right} \rightarrow (H_1 TF3_{Right} - H_2 TF3_{Left})/(H_1^2 - H_2^2)$$

where $H_1$, $H_2$ relate to the location of the two real speakers.

Figure 1B:
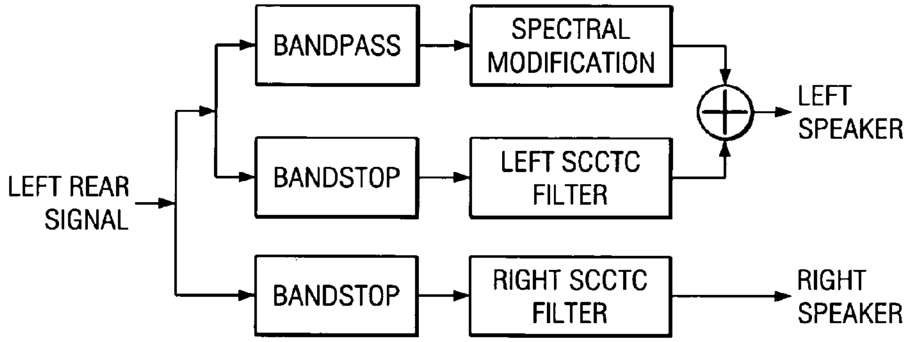

The SCCTC filters used for other channel inputs will be analogous but using the corresponding filters in place of the $TF3_{left}$ and $TF3_{Right}$ filters. In practice however, applying this at every frequency results in a loss of dynamic range due to approximate nulls of $(H_1^2 - H_2^2)$. To cope with this problem, the preferred embodiment can be combined with the preferred embodiment as illustrated in FIG. 1*a*. In particular, the frequency range not treated by cross-talk cancellation can have its spectrum modified by other values for the same side speaker, or reduced to zero for the opposite side speaker (see preceding section for details). A block diagram is shown in FIG. 1*b*. Keep in mind all these blocks are combined into just two filters for the left and right output.

4. Bark Band 2-Channel Virtualizer

Figure 1C:
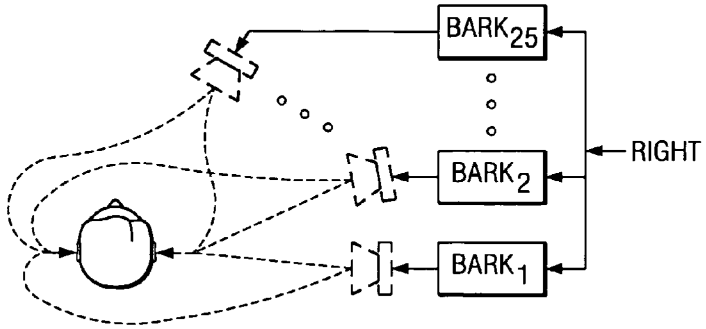

FIG. 1*c* illustrates a preferred embodiment virtualizer which takes two-channel (stereo) input and locates a separate virtual speaker for each Bark frequency band of the input with the virtual speakers spread over a range of angles. That is, in contrast to creation of a virtual speaker for each channel of a multi-channel audio input, a two-channel input can be spread out to give special effects somewhat akin to virtualized multi-channel input. This is a particularly effective approach to two-channel input speaker virtualization and divides the input signals into different frequency bands and places each band at its own location. To maintain continuity, adjacent bands are placed in adjacent directions, although strictly this is not required. Placing different frequency bands at such locations can be thought of as similar to a rainbow effect, since a prism also divides the frequencies of light into adjacent positions.

This "rainbow" virtualizer can be thought of as consisting of a series of low-pass, band-pass and high-pass filters with cut-off frequencies corresponding to standard Bark bands which are listed in FIG. 5. Each band is then filtered with a pair of HRTF filters corresponding to angles from 90 degrees to 30 degrees for the right channel input and from 270 degrees to 330 degrees for the left channel input. Successive HRTFs are 2.5 degrees apart with Bark band 1 (0-100 Hz) at 90 degrees, Bark band 2 (100-200 Hz) at 87.5 degrees, . . . , Bark band 25 (15500-24000 Hz) at 30 degrees. Thus the two ear signals input to the cross-talk canceller (which then drives the two real speakers) are:

$$E_{right}=\Sigma_{1\leqq n\leqq 25}H_1(92.5-2.5n)\mathrm{BP}(n)S_{right}+H_2(267.5+2.5n)\mathrm{BP}(n)S_{left}$$

$$E_{left}=E_{1\leqq n\leqq 25}H_3(267.5+2.5n)\mathrm{BP}(n)S_{left}+H_4(92.5-2.5n)\mathrm{BP}(n)S_{right}$$

where the two input channels are $S_{left}$ and $S_{right}$ and BP(n) is a bandpass filter for the nth Bark band. Of course, by symmetry $H_1(92.5-2.5n)=H_3(267.5+2.5n)$ and $H_2(92.5-2.5n)=H_4(267.5+2.5n)$. Further, the inputs $S_{left}$ and $S_{right}$ factor out of the sums, so the filters can be combined into four artificial "rainbow" HRTFs defined as:

$$\mathrm{TF}_{left\text{-}to\text{-}right}=\Sigma_{1\leqq n\leqq 25}H_2(267.5+2.5n)\mathrm{BP}(n)$$

$$\mathrm{TF}_{right\text{-}to\text{-}right}=\Sigma_{1\leqq n\leqq 25}H_1(92.5-2.5n)\mathrm{BP}(n)$$

$$\mathrm{TF}_{left\text{-}to\text{-}left}=\Sigma_{1\leqq n\leqq 25}H_3(267.5+2.5n)\mathrm{BP}(n)$$

$$\mathrm{TF}_{right\text{-}to\text{-}left}=\Sigma_{1\leqq n\leqq 25}H_4(92.5-2.5n)\mathrm{BP}(n)$$

Figure 1D:
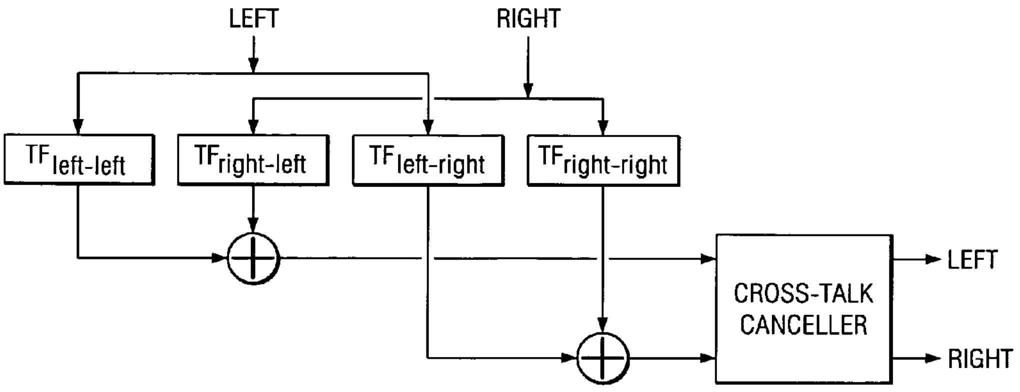

Again by symmetry $\mathrm{TF}_{left\text{-}to\text{-}left}=\mathrm{TF}_{right\text{-}to\text{-}right}$, $\mathrm{TF}_{left\text{-}to\text{-}right}=\mathrm{TF}_{right\text{-}to\text{-}left}$. FIG. 1*d* shows system functional blocks with the artificial HRTFs.

HRTFs for every 5 degrees azimuth in the horizontal plane have been published as noted in the background. The remaining HRTFs can be obtained using interpolation. The lowest Bark band (0-100 Hz) is the farthest from the facing direction, and higher Bark bands become progressively more centered as shown in FIG. 1*d* for the right channel only (the left channel processing is symmetrical).

Figure 1E:
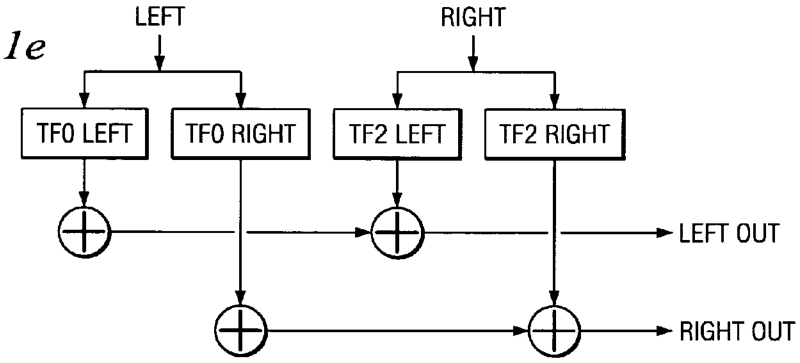

Also, the rainbow HRTF pair can be combined with the cross-talk canceller to produce the four filters in FIG. 1*e*. Note that in the case of symmetry, as is usually assumed, only two sets of coefficients are required. A technique as in section 2 is also used around 8 kHz to improve the cross-talk canceller performance around this frequency.

Figure 1F:
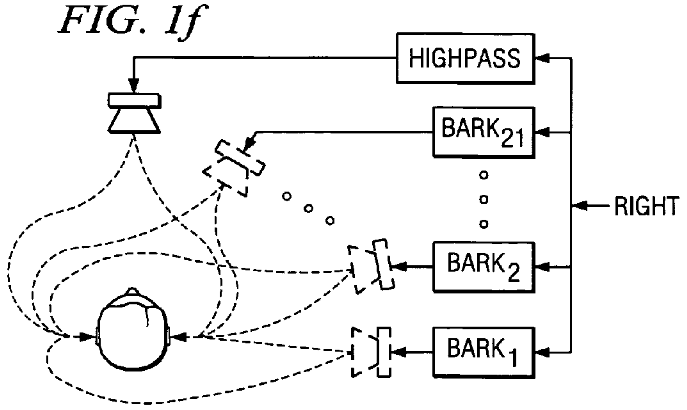

Another useful configuration is to pass high frequencies directly to the two real speakers which helps focus the effect on the mid to lower frequencies, as shown in FIG. 1*f*, in which Bark bands 22-25 are combined.

Although the principle advantage of this approach is to create a pleasant wider sound, the act of separating frequency bands makes it simple to equalize the sound to better match the original. The first implementation achieved a wide pleasant sound, but with noticeable timbre differences to certain brass instruments (becoming more nasal) and some loss of bass. By weighting each bark band when creating the rainbow HRTF pair, these tonal differences can be minimized through equalization, while maintaining the desired effect. A different version which combined Bark bands and fewer HRTF angles (placed every 5 degrees) also produced a good effect, but was less easy to equalize since the frequency bands were larger.

5. Cross-Talk Cancellation Shuffler

FIG. 4*b* illustrates a preferred embodiment cross-talk cancellation shuffler implementation. Non-directional and directional components of stereophonic can be roughly separated through the calculation of the sum and difference signals between left and right channels. Conveniently, this process is performed at the beginning of the shuffler cross-talk cancellation scheme, as shown in FIG. 4*a*. If the target is to bypass the processing of the non-directional components, it is sufficient to replace the inverse filter $1/M_0$ in FIG. 4*a* by an attenuator with a constant attenuation factor k, as shown in FIG. 4*b*. By doing this, a pure monoaural signal does not suffer any transformation (except attenuation) and therefore appears as a phantom image between the speakers. In contrast, difference signals are processed as in conventional cross-talk cancellation, producing the desired effect.

In terms of transfer function matrices, the inverse transform implemented by the preferred embodiment of FIG. 4*b* can be described as:

$$\frac{1}{2}\begin{bmatrix}1 & 1\\ 1 & -1\end{bmatrix}\begin{bmatrix}1/k & 0\\ 0 & 1/S_0\end{bmatrix}\begin{bmatrix}1 & 1\\ 1 & -1\end{bmatrix}$$

The forward transform that describes the hypothetical transformations suffered by the sound waves can be obtained by inverting the foregoing inverse, which results in:

$$\begin{bmatrix}Y_1\\ Y_2\end{bmatrix}=\frac{1}{2}\begin{bmatrix}k+S_0 & k-S_0\\ k-S_0 & k+S_0\end{bmatrix}\begin{bmatrix}X_1\\ X_2\end{bmatrix}$$

This can be interpreted as the superposition of a constant and non-directional component k with a directional component $S_0=H_1-H_2$ that produces opposite effects on the ipsi-lateral and contra-lateral paths. Note that if we replace k by $M_0$, the original shuffler equations are recovered.

Also, if the HRTF matrix is applied to the preferred embodiment cross-talk canceller of FIG. 4*b*, then:

$$\begin{aligned}\begin{bmatrix}Y_1\\ Y_2\end{bmatrix}&=\begin{bmatrix}H_1 & H_2\\ H_2 & H_1\end{bmatrix}\begin{bmatrix}X_1\\ X_2\end{bmatrix}\\ &=\begin{bmatrix}H_1 & H_2\\ H_2 & H_1\end{bmatrix}\frac{1}{2}\begin{bmatrix}1 & 1\\ 1 & -1\end{bmatrix}\begin{bmatrix}1/k & 0\\ 0 & 1/S_0\end{bmatrix}\begin{bmatrix}1 & 1\\ 1 & -1\end{bmatrix}\begin{bmatrix}E_1\\ E_2\end{bmatrix}\\ &=\frac{1}{2}\begin{bmatrix}\frac{H_1+H_2}{k}+1 & \frac{H_1+H_2}{k}-1\\ \frac{H_1+H_2}{k}-1 & \frac{H_1+H_2}{k}+1\end{bmatrix}\begin{bmatrix}E_1\\ E_2\end{bmatrix}\end{aligned}$$

By defining $F=(H_1+H_2)/k$, we can rewrite this as $$2Y_1=F(E_1+E_2)+E_1-E_2$$

$$2Y_2=F(E_1+E_2)-E_1+E_2$$

Note that in a situation where F=1 (i.e., the HRTFs are flat and k is adjusted accordingly), we obtain $Y_1=E_1$ and $Y_2=E_2$, characterizing an ideal cross-talk cancellation effect.

6. Multi-Channel Reverberation

Figure 1G:
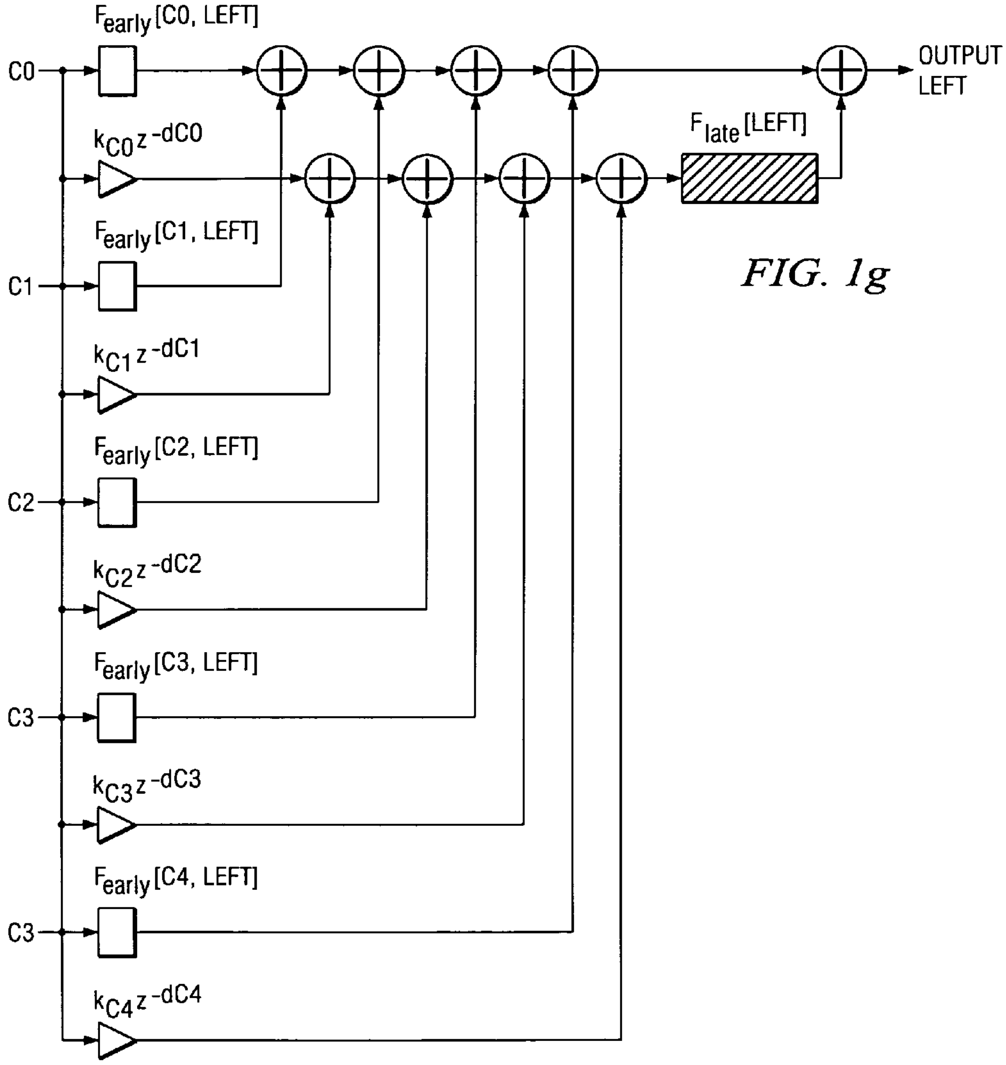

In preferred embodiments with multiple audio channels (for real and/or virtual speakers) each reverberation filter is subdivided into an early arrival section and a shared late reverberation section. The size of the early arrival section can be on the order of 100 coefficients and can be made even shorter by approximating it to a delay followed by a minimum-phase filter; 100 coefficients would correspond to about 2 ms at a 48 KHz sampling rate. The late reverberation section may contain around 8K coefficients in a typical room model with up to 8-th order reflections. The early arrival section is processed in a manner similar to that of FIGS. 2*e*-2*f* but the processing is significantly reduced due to the smaller filter sizes. Indeed, FIG. 2*h* shows the usual left output channel processing, whereas FIG. 1*g* shows the preferred embodiment simplification. In FIG. 1*g* the early arrival filters for the five channels are denoted $F_{early}$[Ci, left], where i=0, . . . , 4.

Late reverberation is realized by a single filter ($F_{late}$) applied to a mixture formed by weighting and delaying the input channels.

The preferred embodiment achieves significant computational savings due to the large late reverberation filter section that is executed only once per output channel. For example, consider the case of 5 input channels and a full reverberation filter containing 8K (8192) coefficients. Each one can be divided into an early arrival section containing 128 coefficients and a late reverberation section containing 8064 coefficients. Using the conventional scheme, the total number of taps would be 10×8192=81920. With the preferred embodiment scheme, the number of taps would be 10×128+8064×2=17408, which is only about 21% of the conventional scheme. Other obvious advantages relate to the amount of memory that is saved by reducing the number of filter coefficients.

Implementing the preferred embodiment consists of designing the late reverberation filter that is shared by all input channels. Straightforward solutions include taking the average across late reverberation filters or selecting one of the late reverberation sections of the full reverberation filters or choosing a subset of reflections from the original filters and combining. In all cases, the final energy for each channel can be adjusted to have the same value as the original filter section by adjusting parameter $k_{ci}$, where i=0, . . . , 4. Energy is defined as the square root of the mean square of the coefficients. Different delays are also introduced in each late reverberation filter section using parameter $d_{ci}$, and they are obtained directly from the original reverberation filter. The gain and delay for each channel i is represented as $k_{ci} \times z^{-dci}$ in FIG. 1*g*, where i=0, . . . , 4. This technique can be combined with other standard techniques to further reduce the computation

7. Modifications

The preferred embodiments can be modified in various ways while retaining one or more of the features of Bark band virtualization, common reverberation for multichannel audio, high frequencies divided out in cross-talk cancellation, and cross-talk cancellation filters combined with multi-channel filters.

For example, the two real loudspeakers can be asymmetrically oriented with respect to the listener which implies four distinct acoustic paths from loudspeaker to ear instead of two and thus an asymmetrical 2×2 matrix to invert for cross-talk cancellation. Similarly, three or more loudspeakers imply six or more acoustic paths and non-square matrices with matrix pseudoinverses to be used for cross-talk cancellations.

Analogously, the virtual locations of Bark bands could be varied so more or fewer high frequencies could be combined, and the Bark bands could be replaced with other decompositions of the audio spectrum into three or more bands.

Similarly, the partition of filters into early and late portions could differ from the partition of the first 128 ($=2^7$) taps for the early portion and the remaining 8068 of the total 8192 ($=2^{13}$) taps for the late portion. For example, the early portion could be anywhere from the first 1% to the first 10% of the total taps.

What is claimed is:

1. A multi-channel audio processor, comprising:

(a) a plurality of multi-channel virtualizer filters for multi-channel audio inputs including rear virtual speaker inputs;

(b) wherein a first filter of said plurality of virtualizer filters includes (i) an input for a rear channel, (ii) a first output to a first input of a cross-talk canceller, and (iii) a second output to a combiner coupled to an output of said cross-talk canceller, said first filter includes a notch filter for a frequency band in a signal path from said input for a rear channel to said first output and a bandpass for said frequency band in a signal path from said input for a rear channel to said second output; and (c) wherein a second filter of said plurality includes (i) an input for said rear channel and (ii) an output to a second input of said cross-talk canceller, said second filter includes a notch filter for said frequency band.

2. The processor of claim 1 wherein said frequency band includes frequencies about 8000 Hz.

3. The processor of claim 1, wherein said plurality of filters and said cross-talk canceller are implemented as programs in memory for a programmable processor.

* * * * *